United States Patent
Tong et al.

(10) Patent No.: US 12,249,373 B2
(45) Date of Patent: Mar. 11, 2025

(54) OTS-BASED DYNAMIC STORAGE STRUCTURE AND OPERATION METHOD THEREOF

(71) Applicant: HUAZHONG UNIVERSITY OF SCIENCE AND TECHNOLOGY, Hubei (CN)

(72) Inventors: Hao Tong, Hubei (CN); Binhao Wang, Hubei (CN); Xiangshui Miao, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 0 days.

(21) Appl. No.: 18/033,075

(22) PCT Filed: Jan. 25, 2022

(86) PCT No.: PCT/CN2022/073841
§ 371 (c)(1),
(2) Date: Apr. 21, 2023

(87) PCT Pub. No.: WO2023/070976
PCT Pub. Date: May 4, 2023

(65) Prior Publication Data
US 2024/0379159 A1    Nov. 14, 2024

(30) Foreign Application Priority Data

Oct. 29, 2021   (CN) .......................... 202111280349.1

(51) Int. Cl.
*G11C 11/16* (2006.01)
*G11C 13/00* (2006.01)

(52) U.S. Cl.
CPC ...... *G11C 13/0069* (2013.01); *G11C 13/0004* (2013.01); *G11C 13/004* (2013.01)

(58) Field of Classification Search
CPC . G11C 13/0069; G11C 13/0004; G11C 13/00; G11C 11/4096; G11C 11/40603;
(Continued)

(56) References Cited

U.S. PATENT DOCUMENTS 9,916,894 B2 *   3/2018   Ha ..................... G11C 13/0004
2006/0221678 A1   10/2006   Bedeschi et al.
(Continued)

FOREIGN PATENT DOCUMENTS

CN          110024034         7/2019

OTHER PUBLICATIONS

"International Search Report (Form PCT/ISA/210) of PCT/CN2022/073841," mailed on Jul. 27, 2022, pp. 1-5.
(Continued)

*Primary Examiner* — Hien N Nguyen
(74) *Attorney, Agent, or Firm* — JCIPRNET

(57) ABSTRACT

Disclosed are an OTS-based dynamic storage structure and an operation method thereof. The OTS-based dynamic storage structure includes a plurality of storage units distributed in an array, and each storage unit includes an OTS gating transistor and a storage capacitor. The OTS gating transistor has two states, namely, high resistance state and low resistance state. When the voltage across the OTS gating transistor exceeds the threshold voltage $V_{th}$, the OTS gating transistor is switched from the high resistance state to the low resistance state. When the voltage across the OTS gating transistor in the low resistance state is lower than the holding voltage $V_{hold}$, the OTS gating transistor is switched from the low resistance state to the high resistance state.

14 Claims, 8 Drawing Sheets

(58) Field of Classification Search
CPC ........ G11C 11/4093; G11C 2211/4068; G11C 11/406; G11C 11/4085; G11C 11/409; G11C 11/4094
See application file for complete search history.

(56) References Cited

U.S. PATENT DOCUMENTS

| | | | |
|---|---|---|---|
| 2017/0372778 A1* | 12/2017 | Ha | G11C 13/0097 |
| 2018/0358093 A1* | 12/2018 | Lesartre | G11C 13/004 |
| 2019/0198106 A1* | 6/2019 | Parkinson | G11C 13/0069 |
| 2020/0192591 A1* | 6/2020 | Navon | G06F 3/0679 |

OTHER PUBLICATIONS

"Written Opinion of the International Searching Authority (Form PCT/ISA/237) of PCT/CN2022/073841," mailed on Jul. 27, 2022, pp. 1-4.

* cited by examiner

OTS-BASED DYNAMIC STORAGE STRUCTURE AND OPERATION METHOD THEREOF

CROSS-REFERENCE TO RELATED APPLICATION

This application is a 371 of international application of PCT application serial no. PCT/CN2022/073841, filed on Jan. 25, 2022, which claims the priority benefit of China application no. 202111280349.1, filed on Oct. 29, 2021. The entirety of each of the above mentioned patent applications is hereby incorporated by reference herein and made a part of this specification.

TECHNICAL FIELD

The disclosure belongs to the technical field of memory, and more specifically relates to an OTS-based dynamic storage structure and an operation method thereof.

DESCRIPTION OF RELATED ART

At present, von Neumann structure is the mainstream structure of a computer, in which the calculation function and the storage function are separated, the calculation function is mainly served by the CPU, and the storage function is mainly realized by the storage structure. With the development of technology, users have higher expectation for the size of products. In the case of ensuring performance, it is expected that the smaller the memory chip, the better. Therefore, the storage density of memory is also an indicator that the disclosure is highly concerned about. At present, DRAM (Dynamic Random Access Memory) is the mainstream memory. DRAM adopts a 1T1C structure, which is composed of a transistor and a storage unit connected in series. Since the transistor is a three-port device, the peripheral control circuit thereof consumes a large area, and three-port devices are not ideal for implementing three-dimensional stacking, which causes the inherent disadvantage of low storage density.

SUMMARY

To overcome the above defects or make improvement to related art, the present disclosure provides an OTS (Ovonic Threshold Switch)-based dynamic storage structure and an operation method thereof, and the purpose of which is to increase the storage density of a storage structure.

In order to achieve the above purpose, according to an aspect of the present disclosure, an OTS-based dynamic storage structure is provided, which is characterized in including a plurality of storage units distributed in an array, and each storage unit includes an OTS gating transistor and a storage capacitor.

In each of the storage units, the first end of the OTS gating transistor is connected to the first end of the storage capacitor, and the second end of the OTS gating transistor and the second end of the storage capacitor are input end and output end corresponding to the storage unit.

The OTS gating transistor has two states, namely, high resistance state and low resistance state. When the voltage across the OTS gating transistor exceeds the threshold voltage $V_{th}$, the OTS gating transistor is switched from the high resistance state to the low resistance state. When the voltage across the OTS gating transistor in the low resistance state is lower than the holding voltage $V_{hold}$, the OTS gating transistor is switched from the low resistance state to the high resistance state.

Preferably, a data writing module is further included. The data writing module includes an operating voltage driving circuit and a selection unit, and the selection unit is configured to connect the operating voltage driving circuit and the storage unit according to the type of written data.

When two different values are pre-written, the selection unit controls the operating voltage driving circuit to apply a preset duration of forward operating voltage $V_{in}$ or reverse operating voltage $V_{in}$ to both ends of the storage unit according to the type of pre-written data. Applying forward operating voltage $V_{in}$ and applying reverse operating voltage $V_{in}$ respectively mean writing two different values, and the amplitude of the operating voltage $V_{in}$ is greater than $V_{th}$.

Preferably, the operating voltage $V_{in}$ includes an operating voltage $V_{in1}$ and an operating voltage $V_{in2}$, and the amplitude of $V_{in1}$ is between $V_{th}$ and $V_{th}+V_{hold}$, and the amplitude of $V_{in2}$ is greater than $V_{th}+V_{hold}$.

When the first value is pre-written, the operating voltage driving circuit applies a preset duration of forward operating voltage $V_{in1}$ to both ends of the storage unit.

When the second value is pre-written, the operating voltage driving circuit applies a preset duration of reverse operating voltage $V_{in1}$ to both ends of the storage unit.

When the third value is pre-written, the operating voltage driving circuit applies a preset duration of forward operating voltage $V_{in2}$ to both ends of the storage unit.

When the fourth value is pre-written, the operating voltage driving circuit applies a preset duration of reverse operating voltage $V_{in2}$ to both ends of the storage unit.

Preferably, a data reading module is further included, the data reading module includes a reading voltage driving circuit and a current detection circuit.

The reading voltage driving circuit is configured to apply a reading voltage $V_{read}$ to the input end of the storage unit, and the value of the reading voltage $V_{read}$ satisfies the following: for the storage units storing different values, after the reading voltage $V_{read}$ is applied, the OTS gating transistor of one kind of value storage unit is in a high resistance state, and the OTS gating transistor of another kind of value storage unit is in a low resistance state. The current detection circuit is configured to detect whether the output end of the storage unit outputs a current to read the stored value after the reading voltage is applied.

Preferably, the operating voltage $V_{in1}$ is applied when data is written, and the reading voltage $V_{read}$ satisfies $V_{th}-V_{in1}+V_{hold}<|V_{read}|<V_{th}+V_{in1}-V_{hold}$ when data is read.

The operating voltage $V_{in2}$ is applied when data is written, and the reading voltage $V_{read}$ satisfies $V_{th}-V_{hold}<|V_{read}|<V_{th}+V_{hold}$ when data is read.

According to another aspect of the present disclosure, a method for operating an OTS-based dynamic storage structure is provided. The operation method includes a data writing operation, and the data writing operation includes: applying a preset duration of forward operating voltage $V_{in}$ or reverse operating voltage $V_{in}$ to both ends of the storage unit, and applying the forward operating voltage $V_{in}$ and applying the reverse operating voltage respectively mean writing two different values, and the amplitude of the operating voltage $V_{in}$ is greater than $V_{th}$.

Preferably, the operating voltage $V_{in}$ includes an operating voltage $V_{in1}$ and an operating voltage $V_{in2}$, and the amplitude of $V_{in1}$ is between $V_{th}$ and $V_{th}+V_{hold}$, and the amplitude of $V_{in2}$ is greater than $V_{th}+V_{hold}$.

When the first value is pre-written, the operating voltage driving circuit applies a preset duration of forward operating voltage $V_{in1}$ to both ends of the storage unit.

When the second value is pre-written, the operating voltage driving circuit applies a preset duration of reverse operating voltage $V_{in1}$ to both ends of the storage unit.

When the third value is pre-written, the operating voltage driving circuit applies a preset duration of forward operating voltage $V_{in2}$ to both ends of the storage unit.

When the fourth value is pre-written, the operating voltage driving circuit applies a preset duration of reverse operating voltage $V_{in2}$ to both ends of the storage unit.

Preferably, after removing the operating voltage $V_{in}$, the storage unit is periodically refreshed to rewrite data.

Preferably, the operation method includes a data reading operation, and the data reading operation includes: applying a reading voltage $V_{read}$ to the input end of the storage unit, and the value of the reading voltage $V_{read}$ satisfies the following: for the storage units storing different values, after the reading voltage $V_{read}$ is applied, the OTS gating transistor of one kind of value storage unit is in a high resistance state, and the OTS gating transistor of another kind of value storage unit is in a low resistance state; detecting whether the output end of the storage unit outputs current to read the stored value after the reading voltage is applied.

Preferably, the operating voltage $V_{in1}$ is applied when data is written, and the reading voltage $V_{read}$ satisfies $V_{th}-V_{in1}+V_{hold}<|V_{read}|<V_{th}+V_{in1}-V_{hold}$ when data is read.

The operating voltage $V_{in2}$ is applied when data is written, and the reading voltage $V_{read}$ satisfies $V_{th}-V_{hold}<|V_{read}|<V_{th}+V_{hold}$ when data is read.

Generally speaking, compared with the related art, the above technical solution conceived by the present disclosure adopts an OTS (Ovonic Threshold Switch) device as a gating device, and adopts the OTS and storage capacitor connected in series as a storage unit, it is possible for the OTS device to realize threshold transition under the control of an external electrical signal. When the electrical signal is applied to the gating device unit and exceeds the threshold voltage, the material transitions from a high resistance state to a low resistance state. Under circumstances, the device is in an on state; then, the applied electrical signal is reduced. When the signal is lower than the holding voltage, the material transitions from a low resistance state to a high resistance state, and the device is in an off state. Such characteristic of the OTS gating transistor may be utilized to control the speed of charging and discharging the capacitor to achieve the purpose of storing information. In this disclosure, the transistor in the DRAM is replaced by OTS device. Since the OTS device is a two-port device, the peripheral circuit thereof consumes less area, and allows easy implementation of three-dimensional stacking, thereby significantly increasing the storage density.

DESCRIPTION OF THE EMBODIMENTS

In order to make the purpose, technical solution and advantages of the present disclosure more clear, the present disclosure will be further described in detail below in conjunction with the accompanying drawings and embodiments. It should be understood that the specific embodiments described here are only used to explain the present disclosure, not to limit the present disclosure. In addition, the technical features involved in the various embodiments of the present disclosure described below can be combined with each other as long as they do not constitute a conflict with each other.

Figure 1:
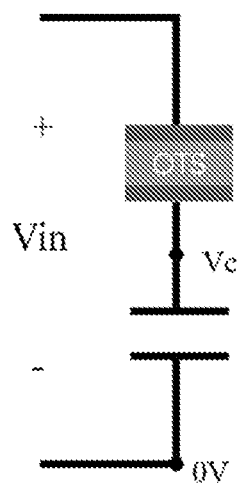
FIG. 1 is a structural diagram of an OTS-based dynamic storage unit according to an embodiment of the present disclosure.

FIG. 1 is a schematic structural diagram of an OTS (Ovonic Threshold Switch)-based storage unit, and the storage unit is the minimum storage unit in a dynamic storage structure. The storage unit is composed of an OTS gating transistor and a capacitor connected in series. The OTS gating transistor has the following characteristics: the OTS gating transistor has two states: a high resistance state and a low resistance state. When the voltage across the OTS gating transistor exceeds the threshold voltage $V_{th}$, the OTS gating transistor is switched from a high resistance state to a low resistance state. When the voltage across the OTS gating transistor in the low resistance state is lower than the holding voltage $V_{hold}$, the OTS gating transistor is switched from a low resistance state to a high resistance state. By utilizing such characteristic of the OTS gating transistor to control the speed of charging and discharging the capacitor, it is possible to achieve the purpose of storing information.

In an embodiment, the dynamic storage structure includes a data writing module, and the data writing module includes an operating voltage driving circuit and a selection unit, and the selection unit is configured to connect the operating voltage driving circuit and the storage unit according to the type of written data. When two different values are pre-written, the selection unit controls the operating voltage driving circuit to apply a preset duration of forward operating voltage $V_{in}$ or reverse operating voltage $V_{in}$ to both ends of the storage unit according to the type of pre-written data. Applying forward operating voltage $V_{in}$ and applying reverse operating voltage $V_{in}$ respectively mean writing two different values, and the amplitude of the operating voltage $V_{in}$ is greater than $V_{th}$.

Specifically, depending on different amplitudes of the operating voltage $V_{in}$, the OTS-based dynamic storage unit has multiple operating modes, which respectively correspond to the operating voltage $V_{in1}$ and the operating voltage $V_{in2}$.

Writing mode 1: The amplitude of the operating voltage $V_{in1}$ applied across the storage unit is between $V_{th}$ and $V_{th}+V_{hold}$.

Figure 2:
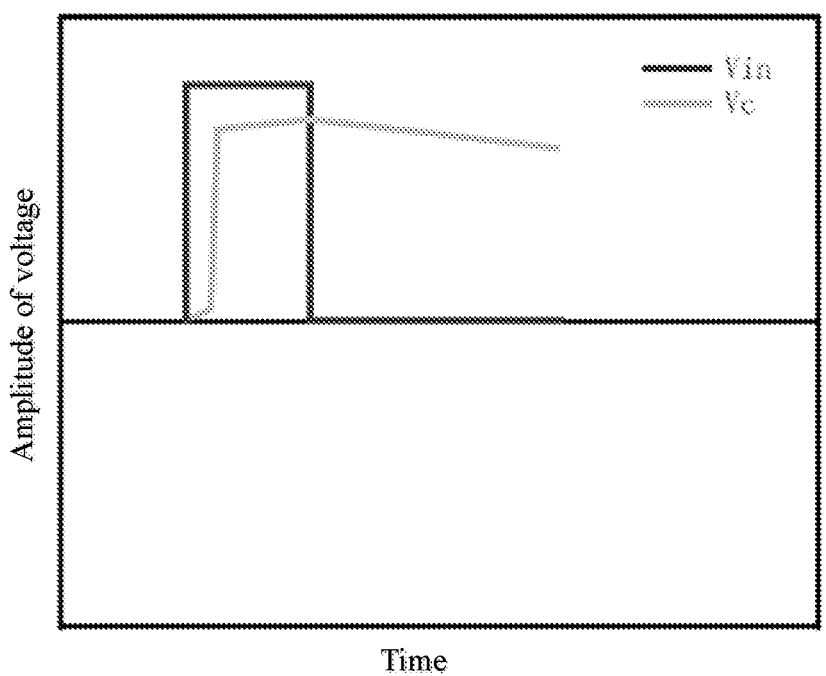
FIG. 2 is a schematic diagram of the change of the voltage Vc across the capacitor when the forward operating voltage $V_{in1}$ is applied to the OTS-based dynamic storage unit.
Figure 3:
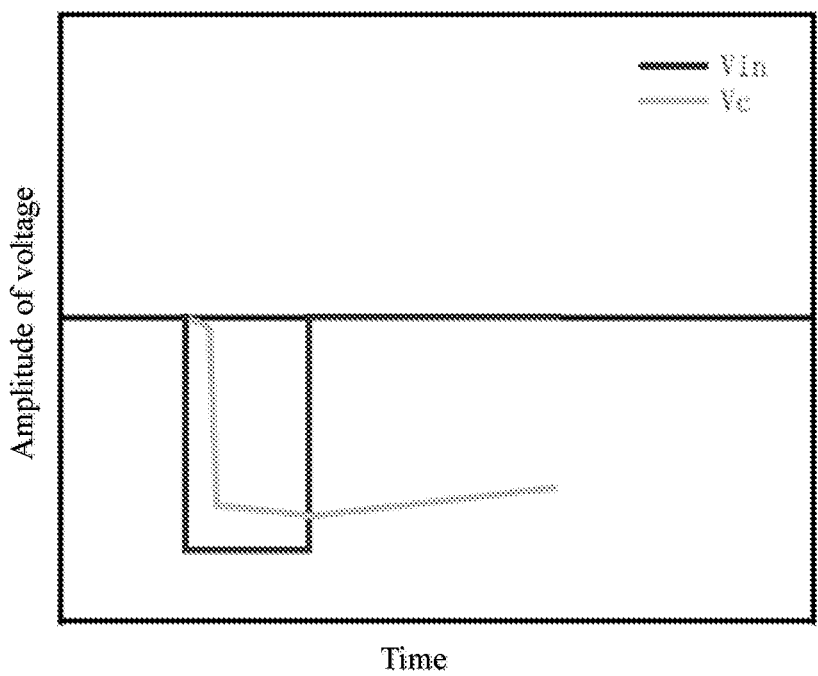
FIG. 3 is a schematic diagram of the change of the voltage Vc across the capacitor when the reverse operating voltage $V_{in1}$ is applied to the OTS-based dynamic storage unit.

The schematic diagram of the operation of the storage unit in mode 1 is shown in FIG. 2 and FIG. 3, FIG. 2 shows applying a positive pulse to the storage unit, and FIG. 3 shows applying a negative pulse to the storage unit.

When no operating voltage is applied, the voltage across the OTS gating transistor is 0, so the OTS gating transistor is in a high resistance state at the initial moment, and the voltage across the capacitor is also 0. When the operating voltage $V_{in1}$ is applied across the storage unit, since the time constant $\tau=RC$ of the storage unit is a large value under the circumstances, the charging current is very small and the capacitor is charged slowly, and therefore it may be approximated that all of the operating voltage at the initial moment is applied to the OTS gating transistor. Since the amplitude of the operating voltage is greater than the threshold voltage $V_{th}$ when the OTS gating transistor is turned on, the OTS gating transistor is switched from a high resistance state to a low resistance state. Under the circumstances, the time constant $\tau=RC$ of the storage unit is a small value, so the charging current suddenly increases to charge the capacitor quickly. While the capacitor voltage rises, since the amplitude of operating voltage is constant, the voltage across the OTS gating transistor drops. When the voltage across the OTS gating transistor drops to the holding voltage $V_{hold}$, the OTS gating transistor is switched from a low resistance state to a high resistance state. Under the circumstances, the time constant $\tau=RC$ of the storage unit is a large value, the charging current decreases, and the voltage across the capacitor rises slowly on basis that $V_{in1}-V_{hold}$. After the preset duration is elapsed, the operating voltage $V_{in1}$ is removed, the voltage $V_{in1}-V_{hold}$ across the capacitor is less than the threshold voltage $V_{th}$, the OTS gating transistor remains in a high resistance state, the current is small, the capacitor is discharged slowly, and the voltage across the capacitor declines slowly on the basis that $V_{in1}-V_{hold}$ to complete writing of data.

The applied operating voltage may be loaded positively or negatively. When forward $V_{in1}$ is applied, after the operating voltage is removed, the capacitor voltage decreases slowly from $V_{in1}-V_{hold}$. When reverse $V_{in1}$ is applied, after the operating voltage is removed, the capacitor voltage rises slowly from $V_{hold}-V_{in1}$.

The applied forward or reverse operating voltage $V_{in1}$ may be regarded as writing two different values.

Taking the value "0" and the value "1" as an example, the applied forward or reverse operating voltage $V_{in1}$ may be regarded as writing "1" or writing "0".

If the application of the forward operating voltage $V_{in1}$ is regarded as writing "1", the corresponding application of the reverse operating voltage is writing "0"; if the application of the forward operating voltage $V_{in1}$ is regarded as writing "0", then the corresponding application of the reverse operating voltage is writing "1".

Writing mode 2: The magnitude of the operating voltage $V_{in2}$ applied across the storage unit is greater than $V_{th}+V_{hold}$.

Figure 4:
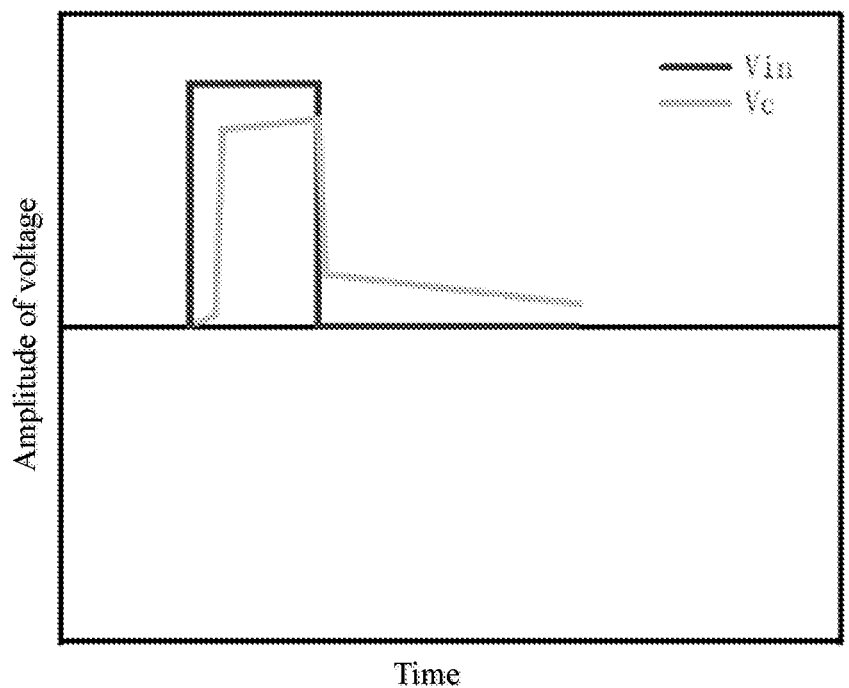
FIG. 4 is a schematic diagram of the change of the voltage Vc across the capacitor when the forward operating voltage $V_{in2}$ is applied to the OTS-based dynamic storage unit.
Figure 5:
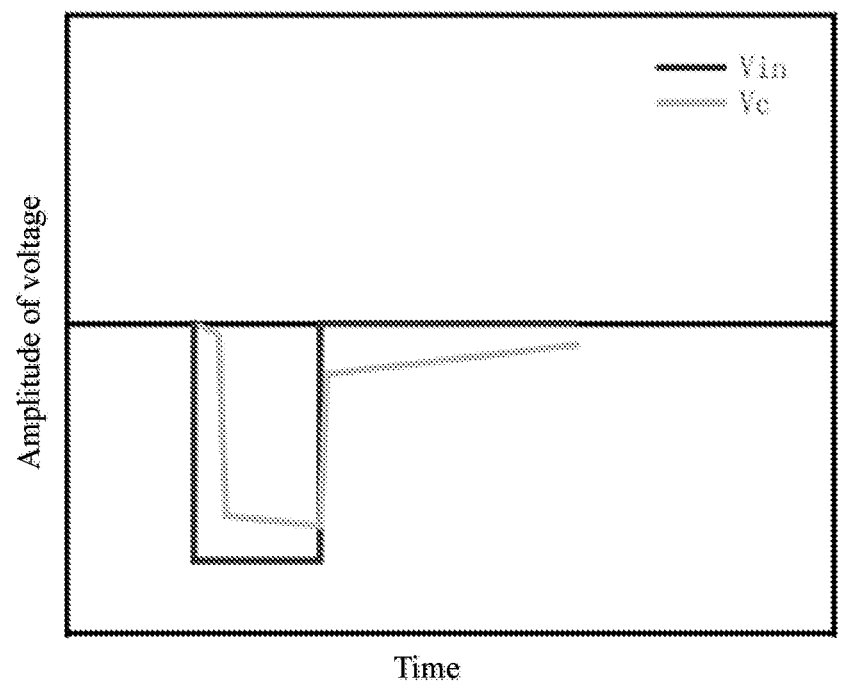
FIG. 5 is a schematic diagram of the change of the voltage Vc across the capacitor when the reverse operating voltage $V_{in2}$ is applied to the OTS-based dynamic storage unit.

A schematic diagram of the operation of the storage unit in mode 2 is shown in FIG. 4 and FIG. 5, FIG. 4 shows applying a positive pulse to the storage unit, and FIG. 5 shows applying a reverse pulse to the storage unit.

When no operating voltage is applied, the voltage across the OTS gating transistor is 0, so the OTS gating transistor is in a high resistance state at the initial moment, and the voltage across the capacitor is also 0. When the operating voltage $V_{in2}$ is applied across the storage unit, since the time constant $\tau=RC$ of the storage unit is a large value under the circumstances, the charging current is very small and the capacitor is charged slowly, and therefore it may be approximated that all of the operating voltage at the initial moment is applied to the OTS gating transistor. Since the amplitude of the operating voltage is greater than the threshold voltage $V_{th}$ when the OTS gating transistor is turned on, the OTS gating transistor is switched from a high resistance state to a low resistance state. Under the circumstances, the time constant $\tau=RC$ of the storage unit is a small value, so the charging current suddenly increases to charge the capacitor quickly. While the capacitor voltage rises, since the amplitude of operating voltage is constant, the voltage across the OTS gating transistor drops. When the voltage across the OTS gating transistor drops to the holding voltage $V_{hold}$, the OTS gating transistor is switched from a low resistance state to a high resistance state. Under the circumstances, the time constant $\tau=RC$ of the storage unit is a large value, the charging current decreases, and the voltage across the capacitor rises slowly on basis that $V_{in2}-V_{hold}$. After the preset duration is elapsed, the operating voltage $V_{in2}$ is removed, the voltage $V_{in2}-V_{hold}$ across the capacitor is greater than the threshold voltage $V_{th}$, the OTS gating transistor is switched from a high resistance state to a low resistance state. Under the circumstances, the time constant $\tau=RC$ of the storage unit is a small value, the discharging current becomes large, and the capacitor is discharged rapidly. When the voltage across the capacitor drops to the holding voltage $V_{hold}$, the OTS gating transistor is switched from a low resistance state to a high resistance state. Under the circumstances, the time constant $\tau=RC$ of the storage unit is a large value, and the discharging current decreases, the voltage across the capacitor drops slowly on the basis of $V_{hold}$, and writing of data is completed.

The applied operating voltage may be loaded positively or negatively. When forward $V_{in2}$ is applied, after the operating voltage is removed, the capacitor voltage drops slowly from $V_{hold}$. When reverse $V_{in2}$ is applied, after the operating voltage is removed, the capacitor voltage rises slowly from $-V_{hold}$.

The applied forward or reverse operating voltage $V_{in2}$ may be regarded as writing two different values.

Taking the value "0" and value "1" as an example, the applied forward or reverse operating voltage $V_{in}2$ may be regarded as writing "1" or writing "0".

If the application of the forward operating voltage $V_{in2}$ is regarded as writing "1", the corresponding application of the reverse operating voltage is writing "0"; if the application of the forward operating voltage $V_{in2}$ is regarded as writing "0", then the corresponding application of the reverse operating voltage is writing "1".

Writing mode 3: The operating voltage $V_{in1}$ is applied to both ends of some storage units, and the operating voltage $V_{in2}$ is applied to both ends of some storage units.

The writing mode 1 and writing mode 2 may both realize binary storage, while writing mode 3 may realize multi-valued storage when being combined with writing mode 1 and writing mode 2.

When the first value is pre-written, the operating voltage driving circuit applies a preset duration of forward operating voltage $V_{in1}$ to both ends of the storage unit.

When the second value is pre-written, the operating voltage driving circuit applies a preset duration of reverse operating voltage $V_{in1}$ to both ends of the storage unit.

When the third value is pre-written, the operating voltage driving circuit applies a preset duration of forward operating voltage $V_{in2}$ to both ends of the storage unit.

When the fourth value is pre-written, the operating voltage driving circuit applies a preset duration of reverse operating voltage $V_{in2}$ to both ends of the storage unit.

Specifically, the first to fourth values may be values "0", "1", "2", and "3".

In an embodiment, the dynamic storage structure is characterized in further including a data reading module, which includes a reading voltage driving circuit and a current detection circuit. The reading voltage driving circuit is configured to apply a reading voltage $V_{read}$ to the input end of the storage unit. The value of the reading voltage $V_{read}$ satisfies the following: for storage units storing different values, after the reading voltage $V_{read}$ is applied, the OTS gating transistor of one of the value storage units is in a high resistance state, and the OTS gating transistor of another of the value storage units is in a low resistance state. The current detection circuit is configured to detect whether the output end of the storage unit outputs current to read the stored value after the reading voltage is applied.

Specifically, there are three reading modes corresponding to the writing mode 3.

Reading mode 1 corresponds to writing mode 1.

The selection of the reading voltage should meet the following conditions: one of the OTS gating transistors corresponding to the two states is turned on, and the other one is turned off.

If the storage unit in the state of $V_{in1}-V_{hold}$ is to be turned off, $V_{read}$ should be less than $V_{th}+V_{in1}-V_{hold}$; if the storage unit in the state of $-(V_{in1}-V_{hold})$ is to be turned on, $V_{read}$ should be greater than $V_{th}-V_{in1}+V_{hold}$.

If the storage unit in the state of $V_{in1}-V_{hold}$ is to be turned on, $V_{read}$ should be less than $V_{th}-V_{in1}+V_{hold}$; if the storage unit in the state of $-(V_{in1}-V_{hold})$ is to be turned off, $V_{read}$ should be greater than $-(V_{th}+V_{in1}-V_{hold})$.

Therefore, the reading voltage $V_{read}$ needs to satisfy $V_{th}-V_{in1}+V_{hold}<|V_{read}|<V_{th}+V_{in1}-V_{hold}$.

Reading mode 2 corresponds to writing mode 2.

The selection of the reading voltage should meet the following conditions: one of the OTS gating transistors corresponding to the two states is turned on, and the other one is turned off. If the storage unit in the state of $V_{hold}$ is to be turned off, $V_{read}$ should be less than $V_{th}+V_{hold}$; if the storage unit in the state of $-V_{hold}$ is to be turned on, $V_{read}$ should be greater than $V_{th}-V_{hold}$. If the storage unit in the state of $V_{hold}$ is to be turned on, $V_{read}$ should be less than $V_{th}-V_{hold}$; if the storage unit in the state of $-V_{hold}$ is to be turned off, $V_{read}$ should be greater than $-V_{th}-V_{hold}$.

Therefore, the reading voltage $V_{read}$ needs to satisfy $V_{th}-V_{hold}<|V_{read}|<V_{th}+V_{hold}$.

Reading mode 3 corresponds to writing mode 3.

In this mode, reading voltage $V_{read}$ needs to satisfy $V_{th}-V_{in1}+V_{hold}<|V_{read}|<V_{th}+V_{in1}-V_{hold}$ corresponding to the storage unit with operating voltage $V_{in1}$ applied when data is written; and reading voltage $V_{read}$ needs to satisfy $V_{th}-V_{hold}<|V_{read}|<V_{th}+V_{hold}$ corresponding to the storage unit with operating voltage $V_{in2}$ applied when data is written.

The present disclosure further relates to an operation method for the OTS-based dynamic storage structure, the operation method includes a data writing operation, and the data writing operation includes the following: applying a preset duration of forward operating voltage $V_{in}$ or reverse operating voltage $V_{in}$ to both ends of the storage unit, and applying the forward operating voltage $V_{in}$ in and applying the reverse operating voltage respectively mean writing two different values, and the amplitude of the operating voltage $V_{in}$ is greater than $V_{th}$.

Specifically, there are three different modes for data writing. For related descriptions, please refer to the writing mode 1, writing mode 2, and writing mode 3 described above, and details will not be repeated here.

When the operating voltage $V_{in}$ is applied across the storage unit, the voltage across the capacitor will eventually rise slowly on the basis of $V_{in}-V_{hold}$. If the operating voltage is applied in a long time length, the voltage across the capacitor will rise excessively, which will cause crosstalk in the storage state. Therefore, it is necessary to control the application time of the operating voltage $V_{in}$ to prevent the voltage across the capacitor from being too high.

When the operating voltage $V_{in}$ is removed, the voltage across the capacitor will drop slowly, and when the voltage drops excessively, crosstalk will occur in the storage state. Therefore, it is necessary to periodically refresh the storage unit and rewrite data. For example, when the voltage across the capacitor drops to make the capacitor voltage corresponding to two or more storage states to be the same, crosstalk will occur in the storage state. Therefore, it is necessary to refresh the storage unit and rewrite the data before the capacitor voltage drops to the point where crosstalk occurs in the storage state.

In an embodiment, the operation method includes a data reading operation, and the data reading operation includes the following: applying a reading voltage $V_{read}$ to the input end of the storage unit, and the value of the reading voltage $V_{read}$ satisfies the following: for the storage units storing different values, after the reading voltage $V_{read}$ is applied, the OTS gating transistor of one kind of value storage unit is in a high resistance state, and the OTS gating transistor of another kind of value storage unit is in a low resistance state; detecting whether the output end of the storage unit outputs current to read the stored value after the reading voltage is applied.

Specifically, the reading operation may be further divided into the following steps:

S1. The read voltage $V_{read}$ of the dynamic storage unit is selected, so that after the voltage is applied across the storage unit, the OTS gating transistor corresponding to the capacitor in the positive bias voltage may be switched from a high resistance state to a low resistance state, and the OTS gating transistor corresponding to the capacitor in the negative bias voltage maintains at a high resistance state; or the OTS gating transistor corresponding to the capacitor in the positive bias voltage maintains at a high resistance state, and the OTS gating transistor corresponding to the capacitor in the negative bias voltage may be switched from a high resistance state to a low resistance state.

S2. A reading voltage $V_{read}$ is applied to both ends of the storage unit to read the current value of the storage unit.

S3. The state of the storage unit is determined according to the obtained current value of the storage unit.

Similarly, there are also three specific modes corresponding to the three different writing modes. For related descriptions, please refer to the reading mode 1, reading mode 2, and reading mode 3 described above, and the details will not be repeated here.

Further description is provided below with reference to preferred embodiments.

Example 1

Figure 6:
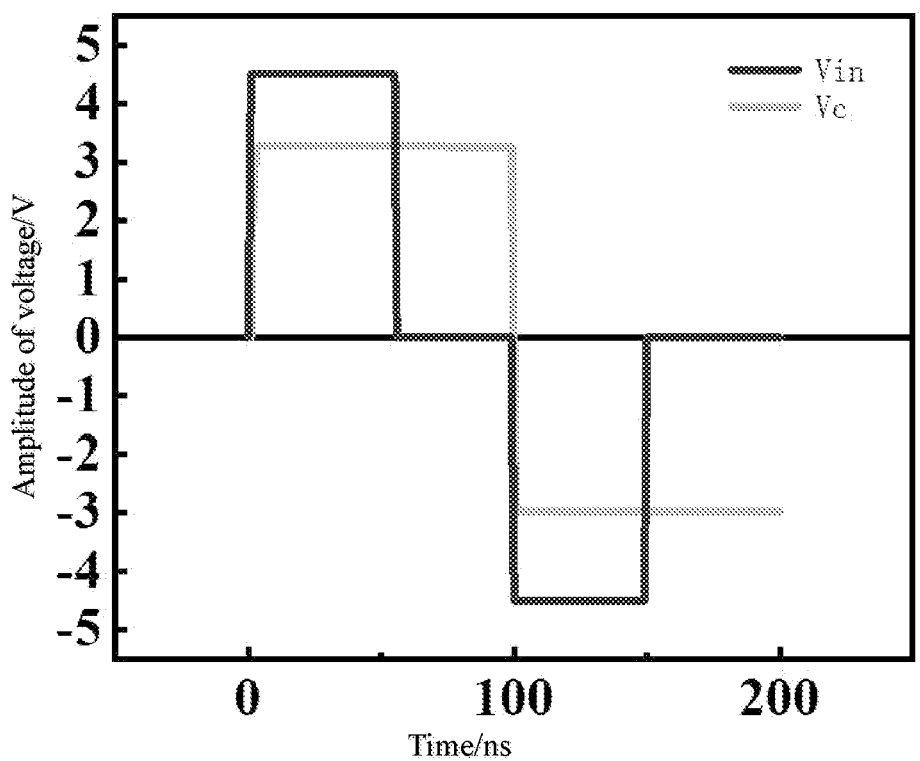
FIG. 6 is a simulation diagram showing change of the voltage Vc on the capacitor when operating voltages with amplitudes of +4.5V and −4.5V are respectively applied to the OTS-based dynamic storage unit.

In an OTS-based dynamic storage unit, the threshold voltage $V_{th}$ is 4.1V, the holding voltage $V_{hold}$ is 1.2V, and the amplitude of the applied operating voltage $V_{in}$ is ±4.5V. As shown in FIG. 6, when the operating voltage of +4.5V is applied to both sides of the storage unit, the OTS unit in the initial state is in a high resistance state, the current is very small, and the capacitor voltage rises slowly. Under the circumstances, the voltage across the OTS unit is approximately +4.5V, which is greater than the threshold voltage of 4.1V. The OTS gating transistor is switched from a high resistance state to a low resistance state, the current increases, the capacitor is quickly charged, and the voltage Vc across the capacitor rises rapidly to 3.3V and maintains stable. After the operating voltage $V_{in}$ is removed, the voltage across the capacitor is 3.3V, which is less than the threshold voltage 4.1V, the OTS gating transistor remains in a high resistance state, the discharging current is small, and the capacitor voltage Vc is maintained at 3.3V. When the operating voltage of −4.5V is applied to both sides of the storage unit, the OTS unit in the initial state is in a high resistance state, the current is small, and the capacitor voltage rises slowly. Under the circumstances, the voltage across the OTS unit is approximately −4.5V, which is greater than the threshold voltage −4.1V. The OTS gating transistor is switched from a high resistance state to a low resistance state, the current increases, the capacitor is quickly charged, and the voltage Vc across the capacitor rises rapidly to −3.3V and maintains stable. After the operating voltage $V_{in}$ is removed, the voltage across the capacitor is −3.3V, which is less than the threshold voltage, the OTS gating transistor remains in a high resistance state, the discharging current is small, and the capacitor voltage Vc is maintained at −3.3V.

Figure 7:
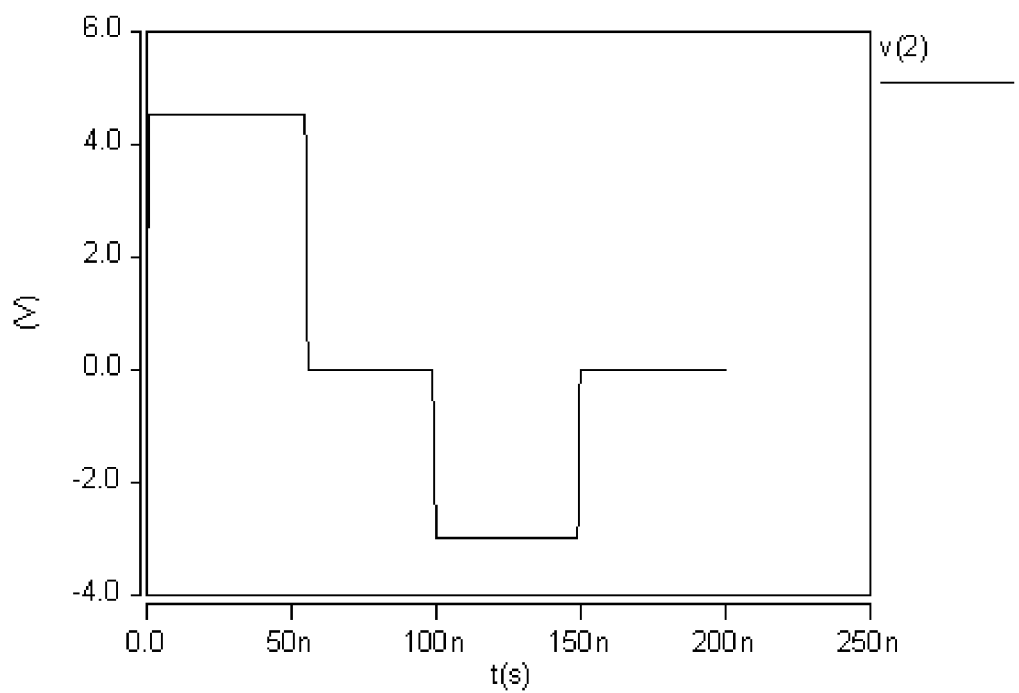
FIG. 7 is a pulse diagram in which a +4.5V operating voltage is applied first to the OTS-based dynamic storage unit, followed by applying a −3V reading voltage.
Figure 8:
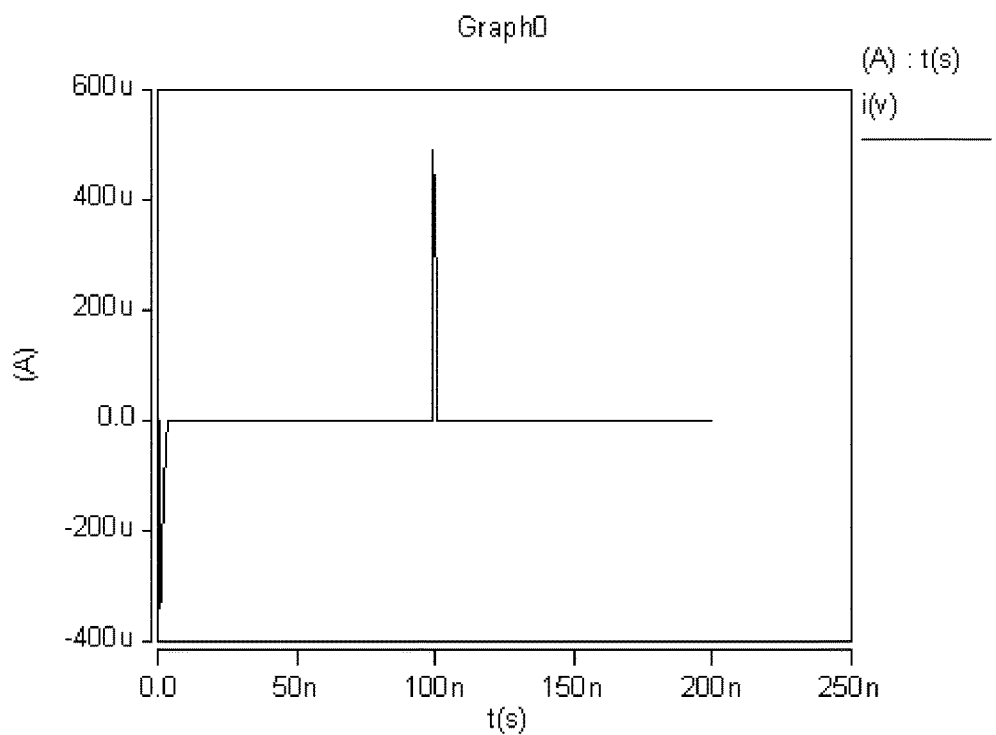
FIG. 8 is a simulation diagram showing current variation of the storage unit after the pulse in FIG. 7 is applied to the OTS-based dynamic storage unit.

When the pulse as shown in FIG. 7 is applied to the storage unit, that is, the operating voltage of +4.5V is applied first, so that the voltage across the storage unit rises to 3.3V, and then the reading voltage of −3V is applied, which is equivalent to applying a voltage of 6.3V to both ends of the OTS gating transistor and the applied voltage is greater than the threshold voltage of 4.1V. The OTS gating transistor is switched from a high resistance state to a low resistance state, the current increases and the capacitor is discharged rapidly. It can be seen that a reading current is generated near 100 ns in FIG. 8.

Figure 9:
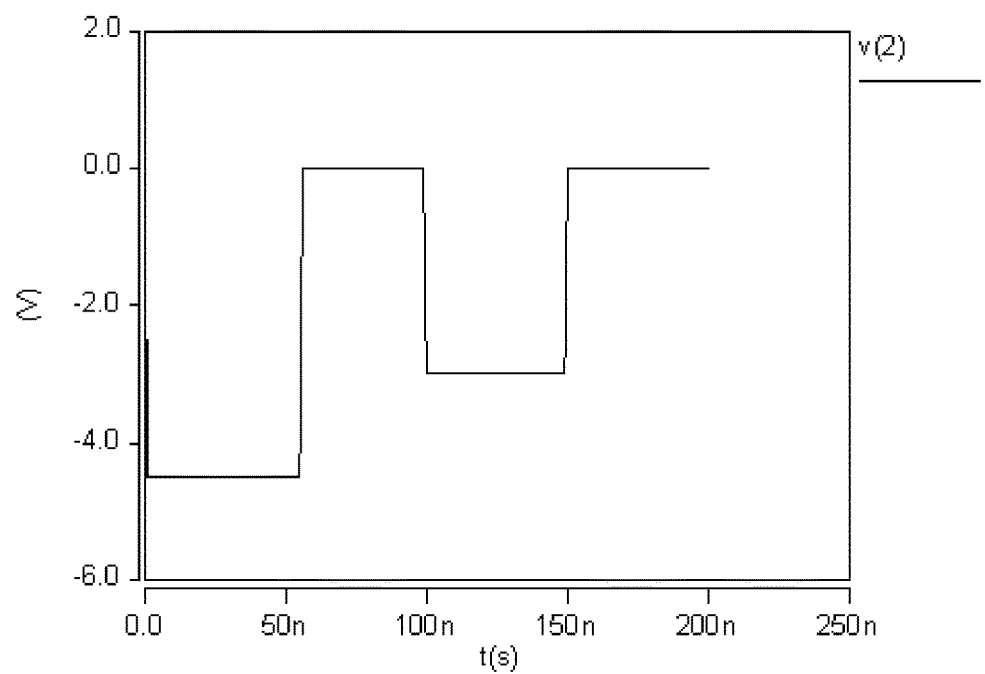
FIG. 9 is a pulse diagram in which a −4.5V operating voltage is applied first to the OTS-based dynamic storage unit, followed by applying a −3V reading voltage.
Figure 10:
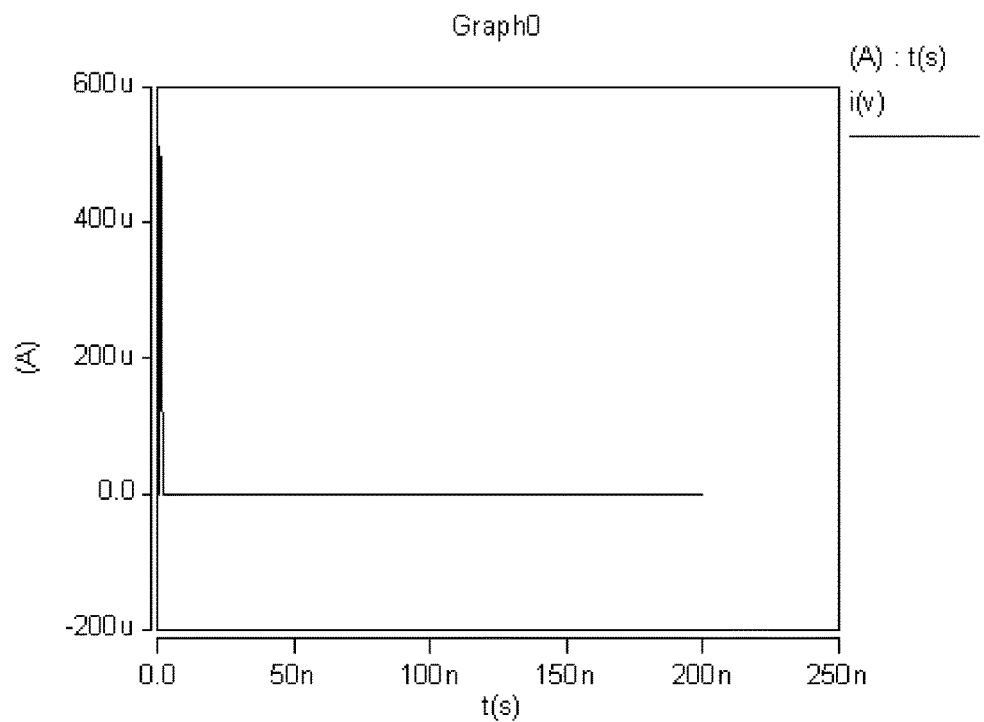
FIG. 10 is a simulation diagram showing current variation of the storage unit after the pulse in FIG. 9 is applied to the OTS-based dynamic storage unit.

When the pulse as shown in FIG. 9 is applied to the storage unit, that is, the operating voltage of −4.5V is applied first, so that the voltage across the storage unit rises to −3.3V, and then the reading voltage of −3V is applied, which is equivalent to applying a voltage of 0.3V to both ends of the OTS gating transistor and the applied voltage is less than the threshold voltage of 4.1V. The OTS gating transistor maintains at a high resistance state, the current is small, and it is impossible for reading current to be generated in FIG. 10.

Example 2

Figure 11:
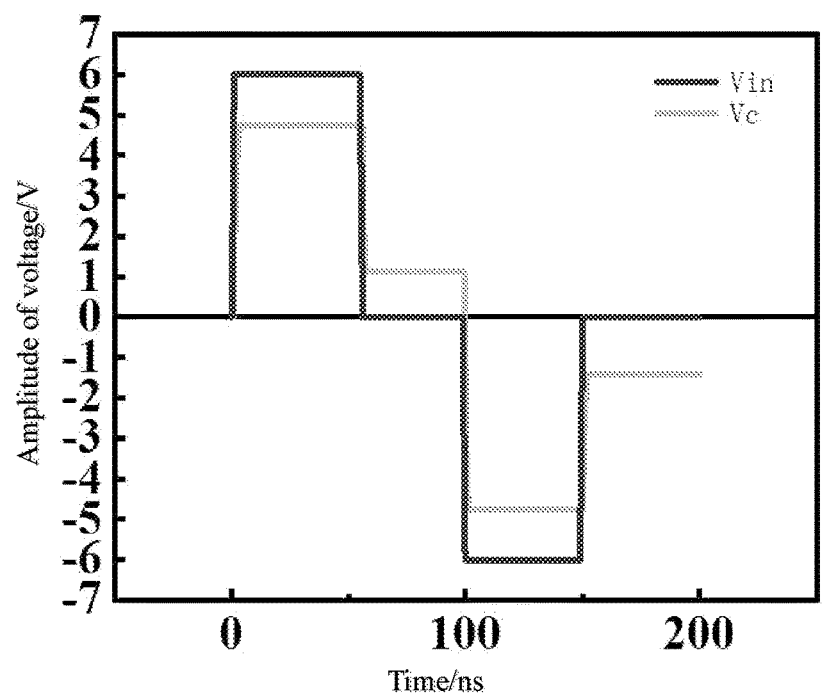
FIG. 11 is a simulation diagram showing the change of voltage Vc on the capacitor when operating voltages with amplitudes of +6V and −6V are respectively applied to the OTS-based dynamic storage unit.

In an OTS-based dynamic storage unit, the threshold voltage $V_{th}$ is 4.1V, the holding voltage $V_{hold}$ is 1.2V, and the amplitude of the applied operating voltage $V_{in}$ is ±6V. As shown in FIG. 11, when the operating voltage of +6V is applied to both sides of the storage unit, the OTS unit in the initial state is in a high resistance state, the current is very small, and the capacitor voltage rises slowly. Under the circumstances, the voltage across the OTS unit is approximately +6V, which is greater than the threshold voltage of 4.1V. The OTS gating transistor is switched from a high resistance state to a low resistance state, the current increases, and the voltage Vc across the capacitor rises rapidly to 4.8V and maintains stable. After the operating voltage $V_{in}$ is removed, since the voltage across the capacitor is 4.8V, which is greater than the threshold voltage 4.1V, the OTS gating transistor is switched from a high resistance state to a low resistance state, the current increases, and the capacitor is discharged rapidly. When the voltage across the capacitor drops to 1.2V, which is less than the holding voltage of 1.2V, the OTS gating transistor is switched from a low resistance state to a high resistance state, the discharging current is small, and the capacitor voltage remains at 1.2V. When the operating voltage of −6V is applied to both sides of the storage unit, the OTS unit in the initial state is in a high resistance state, the current is small, and the capacitor voltage rises slowly. Under the circumstances, the voltage across the OTS unit is approximately −6V, which is greater than the threshold voltage of 4.1V. The OTS gating transistor is switched from a high resistance state to a low resistance state, the current increases, and the voltage Vc across the capacitor rises rapidly to −4.8V and remains stable. After the operating voltage $V_{in}$ is removed, since the voltage −4.8V across the capacitor is greater than the threshold voltage −4.1V, the OTS gating transistor is switched from a high resistance state to a low resistance state, the current increases, and the capacitor is discharged quickly. After the voltage across the capacitor drops to −1.2V, the voltage is less than the holding voltage −1.2V, the OTS gating transistor is switched from a low resistance state to a high resistance state, the discharging current is small, and the capacitor voltage is maintained at −1.2V.

Figure 12:
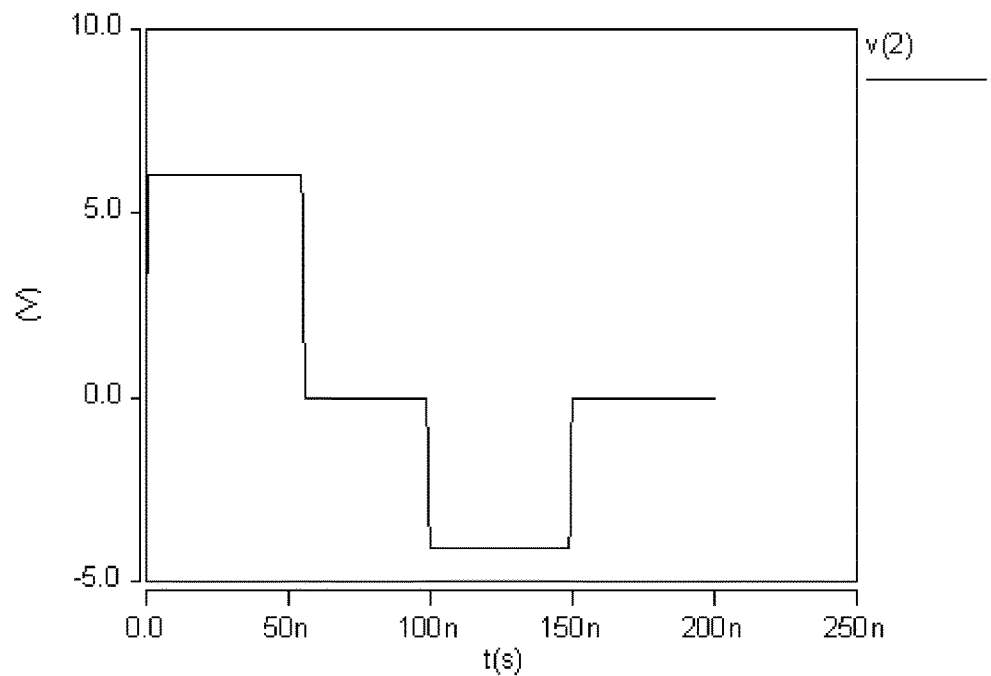
FIG. 12 is a pulse diagram in which a +6V operating voltage is applied first to the OTS-based dynamic storage unit, followed by applying a −4V reading voltage.
Figure 13:
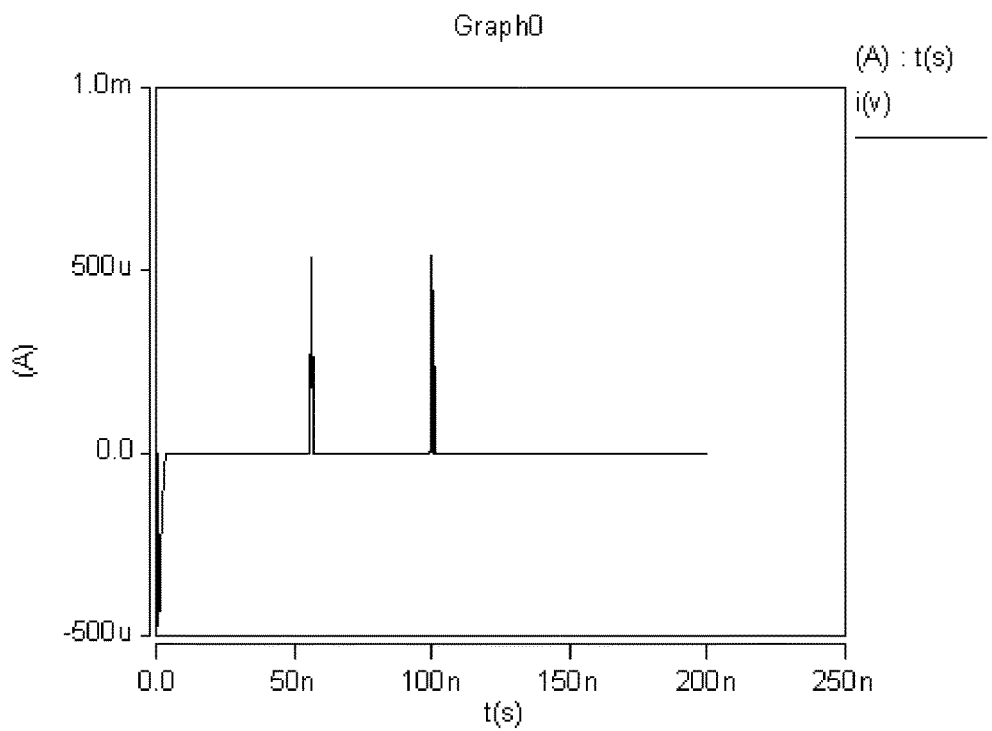
FIG. 13 is a simulation diagram showing current variation of the storage unit after the pulse in FIG. 12 is applied to the OTS-based dynamic storage unit.

When the pulse as shown in FIG. 12 is applied to the storage unit, that is, the operating voltage of +6V is applied first, so that the voltage across the storage unit rises to 4.8V, and then the reading voltage of −4V is applied, which is equivalent to applying a voltage of 8.8V to both ends of the OTS gating transistor, and the applied voltage is greater than the threshold voltage of 4.1V. The OTS gating transistor is switched from a high resistance state to a low resistance state, the current increases, and the capacitor is discharged rapidly. It can be seen that a reading current is generated near 100 ns in FIG. 13.

Figure 14:
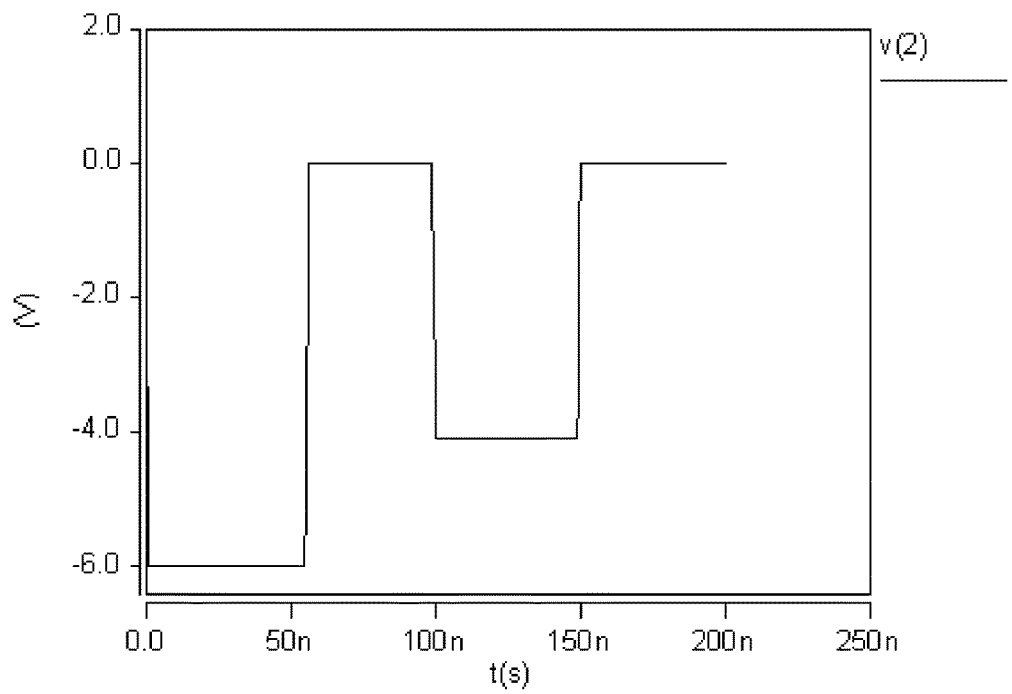
FIG. 14 is a pulse diagram in which a −6V operating voltage is applied first to the OTS-based dynamic storage unit, followed by applying a −4V reading voltage.
Figure 15:
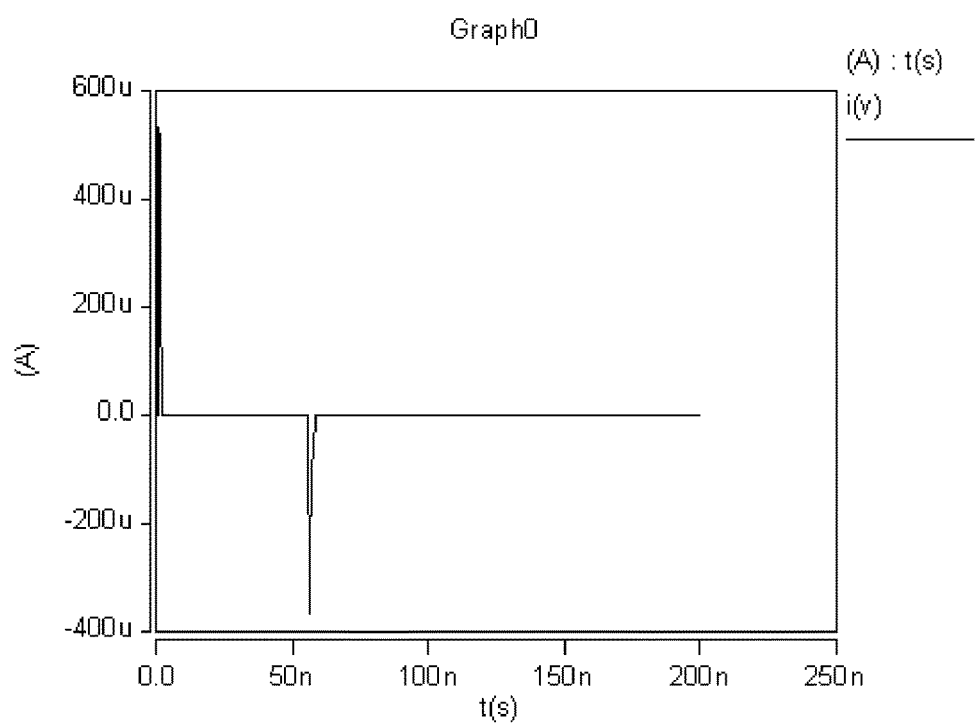
FIG. 15 is a simulation diagram showing current variation of the storage unit after the pulse in FIG. 14 is applied to the OTS-based dynamic storage unit.

When the pulse as shown in FIG. 14 is applied to the storage unit, that is, the operating voltage of −6V is applied first, so that the voltage across the storage unit rises to −4.8V, and then the reading voltage of −3V is applied, which is equivalent to applying a voltage of 1.8V to both ends of the OTS gating transistor, and the applied voltage is less than the threshold voltage of 4.1V. The OTS gating transistor maintains at a high resistance state, the current is small, and it is impossible for reading current to be generated in FIG. 15.

To sum up, the present disclosure adopts an OTS device as a gating device, and adopts the OTS and storage capacitor connected in series as a storage unit, it is possible for the OTS device to realize threshold transition under the control of an external electrical signal. When the electrical signal is applied to the gating device unit and exceeds the threshold voltage, the material transitions from a high resistance state to a low resistance state. Under circumstances, the device is in an on state; then, the applied electrical signal is reduced. When the signal is lower than the holding voltage, the material transitions from a low resistance state to a high resistance state, and the device is in an off state. Such characteristic of the OTS gating transistor may be utilized to control the speed of charging and discharging the capacitor to achieve the purpose of storing information. In this disclosure, the transistor in the DRAM is replaced by OTS device. Since the OTS device is a two-port device, the peripheral circuit thereof consumes less area, and allows easy implementation of three-dimensional stacking, thereby significantly increasing the storage density. By utilizing the characteristics of the OTS gating transistor to control the charging and discharging speed of the capacitor, the purpose of storing information may be achieved. Since the threshold switching device is a two-port device, the peripheral circuit thereof consumes less area, and it is easy to implement three-dimensional stacking, which significantly increases storage density.

It should be noted that the simulation diagrams in the accompanying drawings of the specification of the present disclosure focus on that the operating voltage may be applied to the storage unit first, followed by removing the operating voltage, so that the two ends of the capacitor will maintain a constant voltage. The slow change of the voltage across the capacitor when the OTS gating transistor is in the high resistance stage may be ignored, and which does not affect the elaboration of the principles of the present disclosure.

It is easy for those skilled in the art to understand that the above descriptions are only preferred embodiments of the present disclosure, and are not intended to limit the present disclosure. Any modifications, equivalent replacements and improvements made within the spirit and principles of the present disclosure should all be included within the scope to be protected by the present disclosure.

What is claimed is:

1. An Ovonic Threshold Switch based (OTS-based) dynamic storage structure, the OTS-based dynamic storage structure comprising a plurality of storage units distributed in an array, wherein each of the storage units comprises an OTS gating transistor and a storage capacitor;
   in each of the storage units, a first end of the OTS gating transistor is connected to a first end of the storage capacitor, and a second end of the OTS gating transistor and a second end of the storage capacitor are an input end and an output end corresponding to the storage unit;
   wherein the OTS gating transistor has two states including a high resistance state and a low resistance state, when a voltage across the OTS gating transistor exceeds a threshold voltage $V_{th}$, the OTS gating transistor is switched from the high resistance state to the low resistance state, when the voltage across the OTS gating transistor in the low resistance state is lower than a holding voltage $V_{hold}$, the OTS gating transistor is switched from the low resistance state to the high resistance state.

2. The OTS-based dynamic storage structure according to claim 1, wherein the OTS-based dynamic storage structure further comprises a data writing module, wherein the data writing module comprises an operating voltage driving circuit and a selection unit, and the selection unit is configured to connect the operating voltage driving circuit and the storage unit according to a type of pre-written data,
   when two different values are pre-written, the selection unit controls the operating voltage driving circuit to apply a preset duration of a forward operating voltage $V_{in}$ or a reverse operating voltage $V_{in}$ to both ends of the storage unit according to the type of pre-written data, applying the forward operating voltage $V_{in}$ and applying the reverse operating voltage $V_{in}$ respectively mean writing the two different values, wherein an amplitude of the operating voltage $V_{in}$ is greater than $V_{th}$.

3. The OTS-based dynamic storage structure according to claim 2, wherein the operating voltage $V_{in}$ comprises an operating voltage $V_{in1}$ and an operating voltage $V_{in2}$, and an amplitude of $V_{in1}$ is between $V_{th}$ and $V_{th}+V_{hold}$, and an amplitude of $V_{in2}$ is greater than $V_{th}+V_{hold}$:
   when the OTS-based dynamic storage structure is operated at a first writing mode, the selection unit controls the operating voltage driving circuit to apply a preset duration of a forward operating voltage $V_{in1}$ or a reverse operating voltage $V_{in1}$ to the both ends of the storage unit according to the type of pre-written data;
   when the OTS-based dynamic storage structure is operated at a second writing mode, the selection unit controls the operating voltage driving circuit to apply applies a preset duration of the forward operating voltage $V_{in1}$ or the reverse operating voltage $V_{in1}$ to the both ends of the storage unit according to the type of pre-written data.

4. The OTS-based dynamic storage structure according to claim 2, wherein the OTS-based dynamic storage structure further comprises a data reading module, wherein the data reading module comprises a reading voltage driving circuit and a current detection circuit;
   the reading voltage driving circuit is configured to apply a reading voltage $V_{read}$ to the input end of the storage unit, and a value of the reading voltage $V_{read}$ satisfies the following: for the storage units storing different values, after the reading voltage $V_{read}$ is applied, the OTS gating transistor of one kind of the value storage unit is in the high resistance state, and the OTS gating transistor of another kind of the value storage unit is in the low resistance state;
   the current detection circuit is configured to detect whether the output end of the storage unit outputs a current to read the stored value after the reading voltage is applied.

5. The OTS-based dynamic storage structure according to claim 4, wherein:
   the operating voltage $V_{in1}$ is applied when data is written, and the reading voltage $V_{read}$ satisfies $V_{th}-V_{in1}+V_{hold}<|V_{read}|<V_{th}+V_{in1}-V_{hold}$ when the data is read;
   the operating voltage $V_{in2}$ is applied when the data is written, and the reading voltage $V_{read}$ satisfies $V_{th}-V_{hold}<|V_{read}|<V_{th}+V_{hold}$ when the data is read.

6. An operation method for an Ovonic Threshold Switch based (OTS-based) dynamic storage structure, wherein the OTS-based dynamic storage structure is the OTS-based dynamic storage structure according to claim 1, the operation method comprises a data writing operation, and the data writing operation comprises:

applying a preset duration of a forward operating voltage $V_{in}$ or a reverse operating voltage $V_{in}$ to both ends of the storage unit, and applying the forward operating voltage $V_{in}$ and applying the reverse operating voltage respectively mean writing two different values, wherein an amplitude of the operating voltage $V_{in}$ is greater than $V_{th}$.

7. The operation method according to claim 6, wherein the operating voltage $V_{in}$ comprises an operating voltage $V_{in1}$ and an operating voltage $V_{in2}$, and an amplitude of $V_{in1}$ is between $V_{th}$ and $V_{th}+V_{hold}$, and an amplitude of $V_{in2}$ is greater than $V_{th}+V_{hold}$:

when the OTS-based dynamic storage structure is at a first writing mode, a preset duration of a forward operating voltage $V_{in1}$ or a reverse operating voltage $V_{in1}$ is applied to the both ends of the storage unit;

when the OTS-based dynamic storage structure is at a second writing mode, a preset duration of the forward operating voltage $V_{in1}$ or the reverse operating voltage $V_{in1}$ is applied to the both ends of the storage unit.

8. The operation method according to claim 6, characterized in that wherein after removing the operating voltage $V_{in}$, the storage unit is periodically refreshed to rewrite data.

9. The operation method according to claim 6, wherein the operation method comprises a data reading operation, and the data reading operation comprises:

applying a reading voltage $V_{read}$ to the input end of the storage unit, and a value of the reading voltage $V_{read}$ satisfies the following: for the storage units storing different values, after the reading voltage $V_{read}$ is applied, the OTS gating transistor of one kind of the value storage unit is in the high resistance state, and the OTS gating transistor of another kind of the value storage unit is in the low resistance state;

detecting whether the output end of the storage unit outputs a current to read the stored value after the reading voltage is applied.

10. The operation method according to claim 9, wherein:
the operating voltage $V_{in1}$ is applied when data is written, and the reading voltage $V_{read}$ satisfies $V_{th}-V_{in1}+V_{hold}<|V_{read}|<V_{th}+V_{in1}-V_{hold}$ when the data is read;

the operating voltage $V_{in2}$ is applied when the data is written, and the reading voltage $V_{read}$ satisfies $V_{th}-V_{hold}<|V_{read}|<V_{th}+V_{hold}$ when the data is read.

11. The OTS-based dynamic storage structure according to claim 3, wherein the OTS-based dynamic storage structure further comprises a data reading module, wherein the data reading module comprises a reading voltage driving circuit and a current detection circuit;

the reading voltage driving circuit is configured to apply a reading voltage $V_{read}$ to the input end of the storage unit, and a value of the reading voltage $V_{read}$ satisfies the following: for the storage units storing different values, after the reading voltage $V_{read}$ is applied, the OTS gating transistor of one kind of the value storage unit is in the high resistance state, and the OTS gating transistor of another kind of the value storage unit is in the low resistance state;

the current detection circuit is configured to detect whether the output end of the storage unit outputs a current to read the stored value after the reading voltage is applied.

12. The operation method according to claim 7, wherein after removing the operating voltage $V_{in}$, the storage unit is periodically refreshed to rewrite data.

13. The operation method according to claim 7, wherein the operation method comprises a data reading operation, and the data reading operation comprises:

applying a reading voltage $V_{read}$ to the input end of the storage unit, and a value of the reading voltage $V_{read}$ satisfies the following: for the storage units storing different values, after the reading voltage $V_{read}$ is applied, the OTS gating transistor of one kind of the value storage unit is in the high resistance state, and the OTS gating transistor of another kind of the value storage unit is in the low resistance state;

detecting whether the output end of the storage unit outputs a current to read the stored value after the reading voltage is applied.

14. The operation method according to claim 13, wherein:
the operating voltage $V_{in1}$ is applied when data is written, and the reading voltage $V_{read}$ satisfies $V_{th}-V_{in1}+V_{hold}<|V_{read}|<V_{th}+V_{in1}-V_{hold}$ when the data is read;
the operating voltage $V_{in2}$ is applied when the data is written, and the reading voltage $V_{read}$ satisfies $V_{th}-V_{hold}<|V_{read}|<V_{th}+V_{hold}$ when the data is read.

* * * * *